United States Patent [19]
Smith

[11] Patent Number: 5,475,317
[45] Date of Patent: Dec. 12, 1995

[54] SINGULATED BARE DIE TESTER AND METHOD OF PERFORMING FORCED TEMPERATURE ELECTRICAL TESTS AND BURN-IN

[75] Inventor: Kenneth R. Smith, Plano, Tex.

[73] Assignee: EPI Technologies, Inc., Richardson, Tex.

[21] Appl. No.: 427,974

[22] Filed: Apr. 21, 1995

Related U.S. Application Data

[63] Continuation of Ser. No. 172,580, Dec. 23, 1993, abandoned.

[51] Int. Cl.[6] .................................................. G01R 31/00
[52] U.S. Cl. ............................ 324/760; 324/754; 439/67
[58] Field of Search ................................. 327/760, 754; 439/67

[56] References Cited

U.S. PATENT DOCUMENTS

| | | | |
|---|---|---|---|
| 4,329,642 | 5/1982 | Luthi | 324/158 F |
| 5,006,792 | 4/1991 | Malhi | 324/158 F |
| 5,006,796 | 4/1991 | Burton | 324/158 F |
| 5,123,850 | 6/1992 | Elder | 439/67 |
| 5,302,891 | 4/1994 | Wood | 324/158 F |

*Primary Examiner*—Kenneth A. Wieder
*Assistant Examiner*—Kourosh Cyrus Khosravi
*Attorney, Agent, or Firm*—Jenkens & Gilchrist

[57] ABSTRACT

A reusable test socket is described for testing singulated bare die to determine, before packaging, that the bare die is a "known good die". The socket contains a circuit pad pattern in the mirror image of the bond pad pattern of the bare die to be tested. Each pad of the socket contains a conductive elastomeric probe which has been "screened" onto the bond pad. The socket also contains an alignment template for orienting the bare die onto the elastomeric probes of the pad pattern of the test socket. Additionally, the socket can be a singular piece or it can be made of two main pieces; the first being a socket, and the second being a test board designed to mate with the socket. Further, the socket can be utilized in conjunction with a clamp for holding the bare die in place and with a thermoelectric cooler. The thermoelectric cooler is used to heat or cool the die at all temperatures required for military certification and other extended temperature applications. The disclosed invention also includes a method of using the reusable test socket which includes the steps of placing the bare die onto the test socket, placing the socket into electrical continuity with test equipment, conducting tests at ambient temperatures, subjecting the die to a prolonged period of "burn-in" at elevated temperatures, conducting further electrical tests at various temperatures, and determining whether the bare semiconductor die is a "known good die".

15 Claims, 3 Drawing Sheets

SINGULATED BARE DIE TESTER AND METHOD OF PERFORMING FORCED TEMPERATURE ELECTRICAL TESTS AND BURN-IN

This application is a continuation of application Ser. No. 08/172,580, filed on Dec. 23, 1993, which was abandoned upon the filing hereof.

BACKGROUND OF THE INVENTION

1. Field of the Invention

This invention relates to a method and apparatus of making and using a reusable test socket for testing singulated bare die to determine, without packaging, that the bare die is a "known good die", thereby dramatically increasing yield rates, especially when the die is included in a multi-chip module or hybrid integrated circuit.

2. Description of the Prior Art

Multi-chip Modules (MCMs), or Hybrid Integrated Circuits, are manufactured by combining multiple integrated circuit die within one package. Yield rates for such MCMs are usually low because if any one of the die within an MCM malfunctions, the entire package is considered defective. For example, MCMs which contain 20 individual die, with an average yield rate of 97.3%, would be expected to have an overall yield rate of 57.3% because of the cumulative effect of the individual yield rates of each die. Because the sum cost of the die can be quite expensive, the production of MCMs is frequently unprofitable and the cost to the consumer of MCMs is frequently unjustifiable.

Thus, there is a need to certify that each individual die is a "known good die" prior to packaging the die within the MCM. Some prior art references describe attempts to produce a known good die by first packaging the die, conducting tests at various temperatures, subjecting the integrated circuit to "burn-in" at elevated temperature, recovering the die by destroying the packaging to remove the die and then placing it within the hybrid circuit or MCM. Such a process is labor intensive and expensive and still could result in uncertainty in determining whether a die is a "known good die." Thus, there is a need for a device and method of testing bare die which allow bare die to be tested in a more cost effective manner.

Other prior art references disclose various probe cards which test the die while on the wafer. Some prior art references, such as U.S. Pat. No. 5,103,557 issued to Leedy, disclose performing tests before the metallization layers are added to the individual die still contained on the semiconductor wafer. These tests, however, only certify that a die is good at this stage in its manufacturing cycle. The completely manufactured die is not tested. It is important to test the completely manufactured die because defects can be introduced, not only when the metallization layers are added, but also when the die is separated from the semiconductor wafer.

A problem with the above device and test methods is the utilization of rigid metal probes or probes with rigid metal tips for establishing electrical continuity. Such probes are difficult to manufacture and require high maintenance. Because the individual probes are so minute, the practical difficulties of using probe cards include keeping the probes straight, keeping them at an even or planar height, and establishing electrical contact through all of the probes in the proper location simultaneously without exerting so much pressure on the semiconductor wafer that it is damaged. Additionally, the mere act of establishing electrical contact with the proper points within a circuit can be a challenging task. Frequently, special lenses or cameras are required to accomplish this task. Thus, there is a need for a device which allows the task of connecting test equipment to the die to be routine, simple and quick.

Another problem with using probe cards as disclosed by Leedy is that they typically have inherent frequency response characteristics which inhibit full functional testing of an integrated circuit throughout the desired frequency ranges. Further, these types of probe cards are designed to contact a die while it is still an integral part of the entire semiconductor wafer. They are not intended for testing bare singulated die. Thus, the cards cannot be used to test the overall reliability of the bare die to determine whether the die will work for a significant duration of time. Neither do they provide a means for testing the die over a broad range of temperatures.

Other prior art references, such as European Patent No. 554,622 issued to Pedder, disclose the use of a test socket in connection with a test station wherein the interface between the bare singulated die and the test socket is a plurality of conductive microbumps soldered onto the test socket contact pads. A problem with such a device is that it is very difficult to manufacture bumps such that pad to bump contact is established for all die bond pads because of the rigidness of the solder microbumps. In other words, use of such bumps introduces planarity problems. Furthermore, the use of such bumps does not insure solid and continuous electrical contact with the bare die bond pads. Additionally, the frequency bandwidth is limited. Thus, these metal bumps do not support all of the types of required tests which may have to be performed even if they do successfully establish electrical continuity with the die bond pads.

Other disclosures utilize a polyimide film upon which metallic microbumps are placed. For example, see *Aehr Test, Nitto Denko Develop KGD Solution,* Electronics Packaging & Production, September 1993, at 11–12. The article discloses a plurality of gold or nickel plated bumps on polyimide film with a proprietary hole-making technology which connects the bond pads of a die to the pads of a substrate. The use of such a carrier allows for interfacing a bare die to a burn-in board and for conducting burn-in tests. One problem with such an implementation is the difficulty of plating the small microbumps; the disclosure does not adequately disclose the method of plating the microbumps. A second technical problem is the establishing of electrical continuity between the plated bumps and the pads of a substrate or tester. In fact, in this disclosure, it is clear that this connection means involves the use of a proprietary technology that is not generally available to the public. Finally, this method does not completely solve the previously discussed planarity problem. While the polyimide film establishes some give and take, which helps alleviate the planarity problem, high precision and consistency is still required in order to build a plurality of microbumps, each of which must be sufficiently close to the same plane to establish electrical continuity with the bond pads of the bare die. This occurs because the range of flexible movement resulting from the use of a polyimide film carrying a rigid contact or probe is small. Furthermore, such devices have been known to limit the frequency bandwidth and therefore the types of test and burn-in procedures that can be run or executed.

Other methods of testing bare die include the permanent addition of interface circuitry to the bare die; circuitry which allows the die to be interfaced to a burn-in board. Obvious disadvantages include the increased size and weight of the die packaging. Further, such a solution significantly increases the labor and material costs of testing a bare die. To solve the increased weight and size problem, other disclosures have included the final step of removing or peeling away the added packaging. A well recognized disadvantage of this solution is that the bare die bond pads are frequently damaged as discussed by Falconer and Lippold, *A Survey of Techniques for Producing Known Good Die*, ISHM-Nordic 31st Annual Conference, at 3 (1993).

Because of the low yield rates of MCMs and because testing singulated bare die has heretofore not been economically feasible or technically acceptable, the costs of MCMs have been high when compared to the creation of circuits comprised of the combination of individual integrated circuits which contain the same die as the MCM. Thus, the MCM manufacturing industry has been suppressed relative to the demand for such a product in part because of the high cost of MCMs. Unless a particular design requires minimization of space and power consumption, the high cost of an MCM is not justified. Therefore, up until now, a need has existed to create an apparatus and method of cost effectively testing bare singulated die to produce "known good die" for inclusion in multi-chip modules.

SUMMARY OF THE INVENTION

The invention solves the shortcomings of the prior are by disclosing a reusable test carrier for testing bare singulated semiconductor die. The reusable test carrier utilizes electrically conductive elastomeric bumps (hereinafter, "elastomeric probes") in lieu of rigid metallic probes. The conductive elastomeric probes are permanently applied to an electrically conductive circuit pad pattern of a test carrier whose circuit pad layout is based upon the layout of the bond pad pattern of the bare semiconductor die to be tested. Then, the adhesive quality of the probe is rendered in-adhesive through a curing process. Curing the probes in this manner allows the probes to make repetitive and temporary contact with different die.

A key element in establishing electrical continuity between the pads of the test carrier and the corresponding bond pads of the bare die is the placement of the bare die such that corresponding pads are consistently aligned in contact through the electrically conductive elastomeric probes. The alignment problem has been solved by the utilization of an alignment template. An alignment template consists of a board made out of printed circuit board material, or ceramic, or the like, with an aperture or hole which is approximately the size and shape of the bare die perimeter. The aperture is located within the alignment template such that the placement of the bare die within the aperture or hole forces the corresponding pads to properly align.

A second embodiment for solving the alignment problem contains a number of strips or posts of a hard material that are permanently placed on the surface of the test carrier such that the shape defined by the internal points of the strips or posts approximately defines the perimeter of the die. Like the alignment template, proper alignment of the corresponding bond pads of the die and the circuit pads of the test carrier occurs when the die is placed within the arrangement of strips or posts.

A third embodiment for solving the alignment problem involves using robotics to align and place the die onto the die carrier or test socket.

The method for testing includes, if necessary, removing oxidation from the bond pads of the bare die prior to placing the die within the die carrier and into electrical continuity with the test equipment. The natural build up of oxidation on the bond pads of the die was found to interfere with test results to the point that a good die could feasibly be misdiagnosed as being defective. The method of testing the bare die also includes pushing and securing the die against the conductive elastomeric probes of the die carrier until electrical continuity is established between each bond pad of the die and its corresponding elastomeric probe.

The invention also includes a method for accomplishing elevated temperature burn-in. Specifically, because the die is housed in a temporary package, there is a unique and new need for ascertaining that the die is in continuous electrical communication (ie., electrical continuity exists and-the die is electrically operating) with the circuit or mother board during what is commonly known as "burn-in" testing. Burn-in testing usually occurs within an oven or chamber, and involves continuously operating the device being tested under extreme or at least increased temperature conditions. In ordinary circumstances, when burning in packaged integrated circuits, confidence in established art all but eliminates the need to continuously monitor or verify electrical continuity while the device is being operated in a burn-in board test circuit. However, because this invention utilizes packaging that is used on a temporary basis, continuous electrical continuity cannot be assumed. Thus, the invention discloses a method for verifying electrical continuity. Specifically, the method is to continuously or nearly continuously obtain data or measure electrical voltages from the die by connecting appropriate cables between the burn-in board and test and measurement devices during the burn-in process. A reading of a non-expected value would then indicate either failure of the die or a break in electrical continuity.

Additionally, the method for testing includes a means of lowering or elevating the temperature of the die under test (DUT) by conductive heat transfer to or from the DUT by placing a thermoelectric cooler CHIC) in thermal contact with the die. Use of the TEC is preferred in lieu of current methods of convective heat transfer using conventional forced air temperature forcing devices.

The elastomeric conductive probes and the alignment template or posts primarily accomplish the overall object of this invention which is to provide an apparatus and method for testing bare singulated die that greatly reduces the cost of such tests which makes testing cost effective and affordable and dramatically improves yields of multi-chip modules.

DESCRIPTION OF THE PREFERRED EMBODIMENT

The present invention, in all of its embodiments, solves deficiencies of the prior art to achieve testing of a bare singulated die by creating a die carrier which is designed to hold a bare singulated die and to establish electrical continuity with the bond pads of the bare die. These deficiencies are primarily solved by the utilization of electrically conductive elastomeric probes to contact the bond pads of a die, an alignment template to position the die, and an overall configuration which allows for repetitive and labor efficient use. Furthermore, the bare die can be held in place throughout testing. This allows the bare die to be tested and certified for all required temperatures. The specific tests conducted vary and are determined by the complexity of the bare die and by the certification requirements for the die. One skilled in the art can readily determine what testing is appropriate and can use this disclosure to perform the tests. Nonetheless, the specific test procedures used by this inventor are also disclosed.

Figure 1:
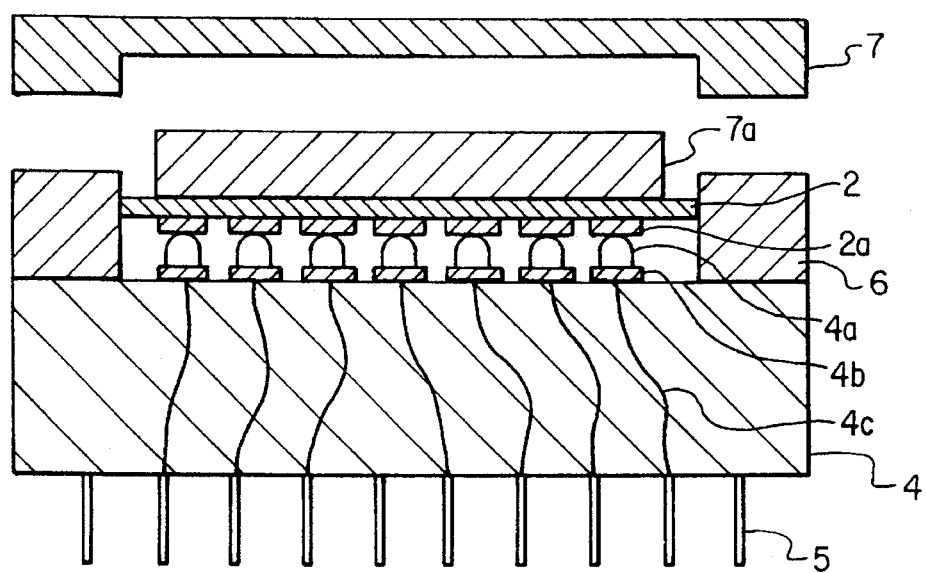
FIG. 1 shows a cutaway view of a die carrier in a conventional socket configuration with TEC and heat exchanger.

As is seen in FIG. 1, electrical contact between the circuit pads 4b of a die carrier 4 and the bond pads 2a of a bare die 2 occurs through the elastomeric probes 4a. Specifically, die carrier 4 contains a plurality of circuit pads 4b which are arranged to correspond with the bond pads 2a of the bare die 2 such that the bond pads 2a of the bare die 2 line up directly over the circuit pads 4b of the die carrier 4 when the bare die 2 is properly positioned over the die carrier 4. The method of placing the circuit pads 4b on the surface of the die carrier 4 is old and well known in the art. One inventive aspect of the disclosure is the permanent placement of conductive elastomeric probes 4a upon circuit pads 4b, wherein the elastomeric probes 4a have been designed to continuously and repetitively establish electrical continuity between it and either bond pads 2a of different die 2, or any other type of electrically conductive probe or lead including other elastomeric probes. Specifically, after the probes are placed onto the circuit pads 4b, they are cured to establish a resilient non-adhesive surface to support repetitive contacts with other conductors. It is not a requirement that every bond pad 2a on the die 2 have a corresponding circuit pad 4b on the die carrier 4. The only circuit pads 4b required on the die carrier 4 are the ones through which electrical signals are to be applied and/or measured during testing. However, for the sake of simplicity and engineering economy, the preferred embodiment includes a pad pattern on the die carrier 4 which is a mirror image of the bond pad pattern of the bare die 2.

Still referring to FIG. 1, each circuit pad 4b of the die carrier 4 contains an electrically conductive elastomeric probe 4a which is permanently mounted thereon. Various methods can be utilized for depositing these conductive elastomeric probes 4a on the circuit pads 4b. However, the one found to be the most satisfactory to this inventor is to have the conductive elastomeric probes 4a screened or stenciled onto the circuit pads 4b and cured through conventional methods as are known by those skilled in the art as described. For example, see U.S. Pat. No. 5,074,947 which is incorporated herein by reference for all purposes.

The composition of the elastomeric probes is not significant so long as the elastomeric probes 4a meet certain performance criteria. The performance criteria for testing bare die include: (1) the elastomer must be able to withstand wide ranges of temperature, the minimum sustained temperature being minus 55° Celsius and the maximum sustained temperature being plus 125° Celsius (in the event Military certification is desired); (2) the elastomeric probes 4a must be somewhat malleable in texture; and (3) the elastomeric probes 4a must provide a low throughput resistance over a wide frequency range and must be able to freely conduct electricity as a result of being doped with a proper conductive doping agent as is known by those skilled in the art. If this disclosed device is to be used to test other devices such as discretes, then the requirements may change. For instance, one military certification standard requires the minimum sustained temperature to be minus 65° Celsius and maximum sustained temperature to be plus 175° Celsius. Such changes are intended to be a part of the disclosed invention. Furthermore, it is important that the elastomeric probes 4a be able to maintain their properties through multiple uses. The composition of acceptable elastomers include, but are not limited to, polyepoxides, polystyrenes, polyimides and other elastomeric polymers and epoxies. The preferred material is an electrically conductive epoxy resin. Proper doping agents to impart electrical conductivity to the resins include tungsten, gold, copper and silver. The preferred doping agent is silver which has been used to render adhesives electrically conducting as described in U.S. Pat. Nos. 5,196,371 and 5,237,130, both being issued to Kulesza et al, incorporated herein for all purposes. However, the concept of utilizing conductive polymers can be manifested in other similar and undeveloped compounds or with other doping agents not mentioned herein and is an intended part of the invention. Such substitutions are insignificant.

Figure 2:
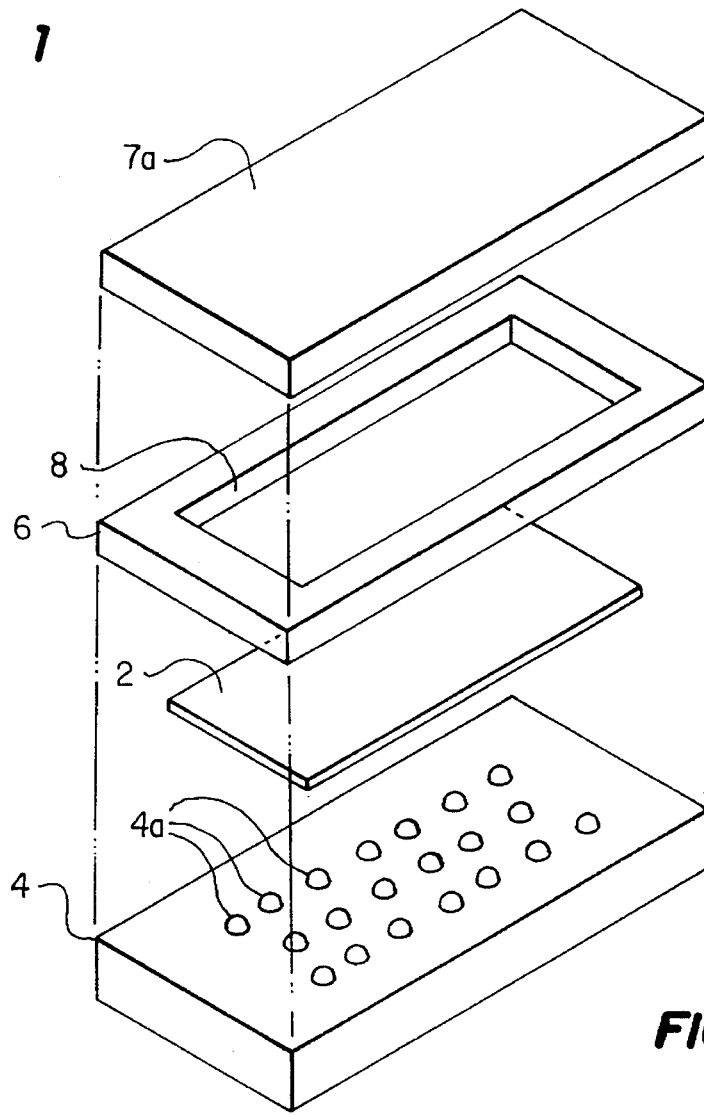
FIG. 2 shows an exploded view of the parts that go within a production socket.

There are at least three means for orienting the bare semiconductor die 2 onto the elastomeric probes 4a which are permanently mounted upon the circuit pads 4b of the die carrier 4. FIGS. 2 shows one means for orienting; namely, an alignment template 6. The alignment template 6 is permanently mounted onto the die carrier 4 (as is also shown in FIGS. 1, 3, 5 and 6). Referring again to FIG. 2, the alignment template 6 contains an aperture 8 corresponding to the size and shape of the bare die 2 being tested. This alignment template 6 is designed to receive the bare die 2 and to orient the bond pad 2a pattern of the die 2 into alignment with the corresponding electrically conductive elastomeric probes 4a of the die carrier 4.

Still referring to FIG. 2, the alignment template 6 has an outer perimeter, size and shape which is substantially the same as the outer perimeter of the die carrier 4. Furthermore, the alignment template 6 is made out of a substance whose thermal coefficient of expansion matches that of the die carrier 4 and is designed to be permanently mounted on top it. For example, the alignment template 6 may be made either out of a polyimide sheet, a printed circuit board, a ceramic material or any other high temperature, high dielectric strength material. The corresponding die carrier 4 may be made out of printed circuit board, ceramic or other high temperature, high dielectric strength materials. As is shown in FIGS. 1, 3, 5 and 6, the alignment template 6 is attached to the top surface of die carrier 4.

In the preferred embodiment of this invention, the use of ceramic substrate material for fabrication of the die carrier 4 and a ceramic alignment template 6 are utilized. It is not significant that the practitioner utilize a substance other than printed circuit board material for the die carrier or a polyimide sheet for the alignment template. Thus, the actual embodiment or material of an alignment template is not significant and is included herein as a part of the invention.

Figure 4:
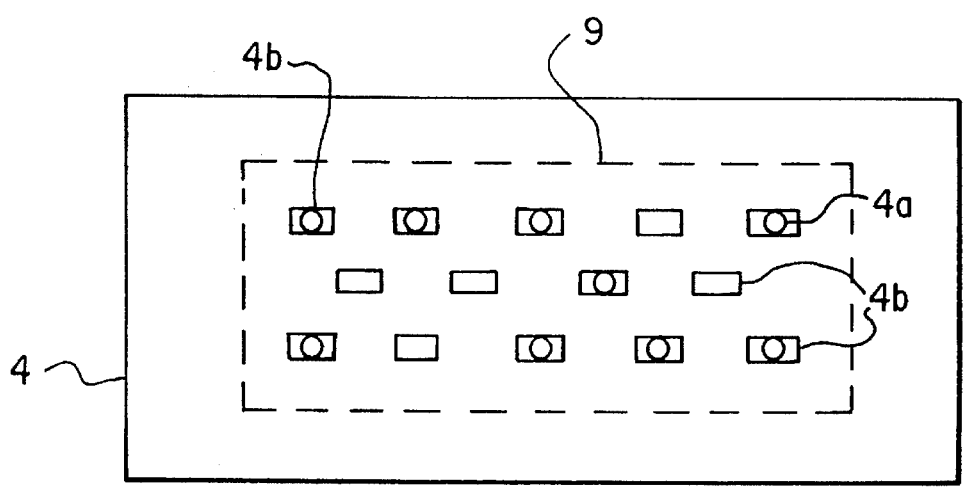
FIG. 4 shows a top view of a die carrier with guidance points.

In another embodiment of the means for orienting the die in position for testing, small and firm protrusions placed to define the area in which a bare die 2 is to be placed, herein "guidance points 9", are permanently mounted onto the die carrier 4. Referring to FIG. 4, the bare die 2 (not shown) fits within the pattern of guidance points 9 such that the bond pads 2a of bare die 2 (not shown) contact the elastomeric probes 4a of the die carrier 4 whenever the die 2 is placed within the pattern of guidance points 9. It is helpful to visualize the arrangement of these guidance points 9 as a series of fence posts which define the perimeter of the shape of the die wherein the die 2 fits exactly within this perimeter of guidance points 9. FIG. 4 illustrates a top view of this relationship between the arrangement of circuit pads 4b of a die carrier 4 and an arrangement of guidance points 9. Note that not all of the circuit pads 4b contain a conductive elastomeric probe 4a. The only requirement is that, at a minimum, the circuit pads 4b through which electrical signals must be supplied or monitored will contain elastomeric probes 4a. However, for other reasons, a practitioner can determine if it is desirable to have additional elastomeric probes. For example, requirements of structural support or engineering economy may encourage the utilization of "extra" probes 4a.

In another embodiment of the means for orienting, a robotic device (not shown), i.e., a computer controlled mechanical arm, is used to pick up the die 2 from an input tray or "waffle pack" (not shown), place it pads down onto the die carrier 4 with high precision, and to hold the bare die 2, onto the elastomeric bumps 4a of the die carrier 4 such that the die bond pads 2a maintain electrical continuity with the circuit pads 4b of the carrier 4. To establish this electrical continuity, the robot arm (not shown) not only orients the die 2 such that the die bond pads 2a are in communication alignment with the circuit pads 4a of the die carrier, but also pushes or forces the die 2 at least to the point that the bond pads 2a are in firm and electrical contact with the electrically conductive elastomeric probes 4b. The robotic mechanism is programmed to place the die 2 repeatably and with great accuracy, thereby providing for a higher rate of handling than with manual placement. The robotic mechanism also can remove the tested die 2 from the carrier 4 and place it in the appropriate output tray or waffle pack, separating good die 2 from failures. The obvious advantage of this embodiment is that it is oriented for assembly line style testing with low overhead labor costs.

There are at least three basic embodiments for the means for connecting the die to a given test instrument. One embodiment is seen in FIG. 1 where the means for connecting is standard circuit wiring which electrically connects the circuit pads 4b of the die carrier 4 to its leads 5. Each circuit pad 4b of the die carrier 4 will be connected to at least one lead 5 of the die carrier 4.

FIG. 1 also illustrates bare die 2 being within the alignment template 6 wherein the bond pads 2a of the bare die 2 are in contact with the elastomeric probes 4a which are permanently mounted on the circuit pads 4b of the die carrier 4 which in turn are connected to the individual leads 5 through the connection lines 4c. For the sake of clarifying the invention, the figures show bare die 2 with raised bond pads 2a. However, it is common to recess the bond pads 2a into the die. Thus, the malleable nature of the probes 4a assists in establishing continuity between the bond pads 2a and the probes 4a. The leads 5 and connection lines 4c (and connection lines 10b of the carrier connector 10 as is shown in FIG. 3) used to interface the die carrier to other circuitry may vary in composition and orientation and are not a significant part of this invention.

However, there may be leads 5 on the die carrier 4 which are unconnected to the circuit pads 4b. The exact arrangement or electrical interconnection between the circuit pads 4b and the leads 5 is a function of the number of bond pads 2a of the die 2 to which electrical continuity must be established for the purposes of testing. Because such arrangements will vary widely according to the particular die 2 being testing in relation to the test requirements for that die 2, the specific arrangement cannot be specified herein. However, one skilled in the art can readily ascertain without undue experimentation what the interconnect scheme should be.

Figure 3:
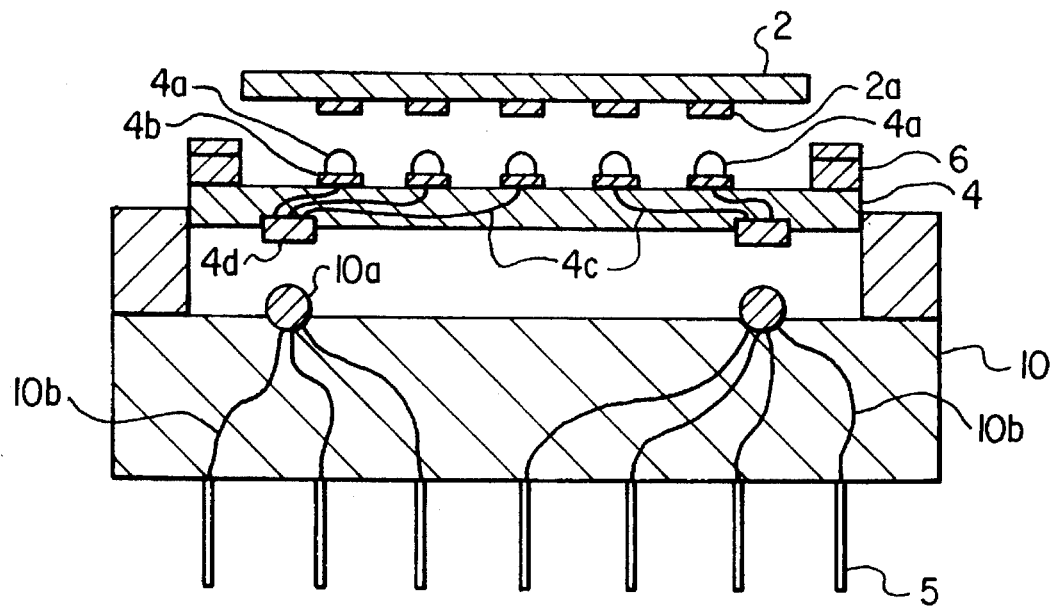
FIG. 3 shows a cutaway view of a bare die, an alignment board, a die carrier and a carrier connector.

In a second embodiment of the means for connecting, as is shown in FIG. 3, a die carrier 4 mates with a carrier connector 10. The circuit pads 4b of the die carrier 4 are placed upon its top surface while its connection pads 4d are placed on its bottom side. The carrier connector's connection pads 10a are individually connected to the leads 5 of the carrier connector 10 through connection lines 10b.

The connection pads 4d of the die carrier 4 and the connection pads 10a of the carrier connector 10 can be arranged in any format. One good arrangement is to have a row of connection pads 4d of the die carrier 4 at each end of the die carrier 4. The carrier connector 10 contains a similar arrangement wherein the row of carrier connector's connection pads 10a on the carrier connector 10 is designed to make electrical contact with the row of connection pads 4d of the die carrier 4. The arrangement of the carrier connector's connection pads 10a is immaterial so long as the placement corresponds with, or is a mirror image of, the connection pads 4d of the die carrier 4. One advantage of this embodiment, namely the use of a carrier connector 10, is that one carrier connector 10 could interface with a multitude of die carriers 4 with a matching arrangement of connection pads 4d.

Figure 5:
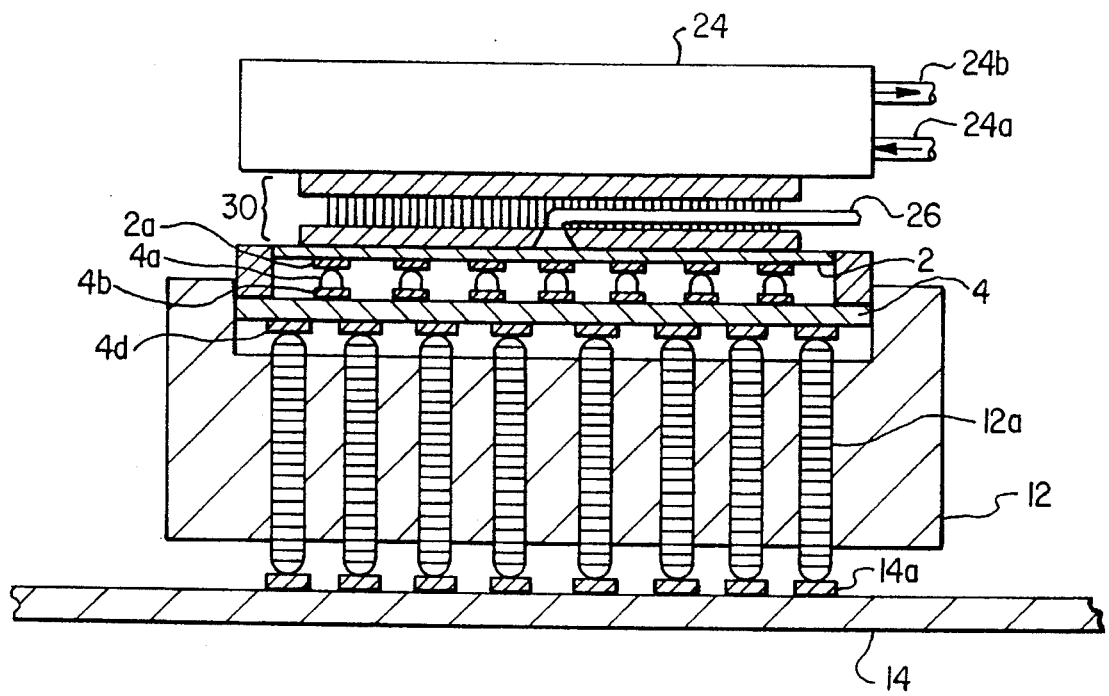
FIG. 5 shows a cutaway view of a die carrier in a surface mount configuration.

In a third embodiment of the means for connecting, as is shown in FIG. 5, a surface mounted carrier connector 12 is mounted to the surface of a burn-in board 14 (or "mother board"). However, instead of utilizing metal pins (not shown) which must be soldered to the burn-in board 14, this surface mounted carrier connector 12 uses an elastomeric interconnection lead 12a, as disclosed by U.S. Pat. No. 5,074,947, to establish electrical continuity between the burn-in board connection pads 14a and the bottom connection pads 4d of a die carrier 4. Use of this type of carrier connector for surface mount applications is advantageous because of lower labor cost in installing it when compared to the carrier connector 12 or any other device utilizing metal leads 5 which require soldering of the individual leads 5. Further, the elastomeric interconnect leads 12a have an increased frequency bandwidth in comparison to the thin metallic leads 5a of the standard carrier connector.

Referring again to FIG. 2, the ceramic spacer 7a is designed to be placed between the alignment template 6 and a socket lid 7 (as shown in FIG. 1) of a production socket (not shown) which houses the die carrier 4, the alignment template 6 and the bare die 2. The purpose of the spacer is to urge the die against the elastomeric probes 4a. However, the spacer and production socket (not shown) are designed so that a thermoelectric cooler (TEC) 30 (as is shown in FIG. 5) can be substituted for the spacer 7a to allow for testing at temperatures above or below ambient.

Referring to FIG. 5, the preferred mechanical and physical relationships between an auxiliary cooling heat exchanger 24, a thermoelectric cooler 30, a bare die 2, a die carrier 4 and surface mounted carrier connector 12, in a surface mount socket configuration are shown. The TEC 30 is placed adjacent to and is urged into direct contact with the bare die 2. Furthermore, an auxiliary cooling heat exchanger 24 is urged against the hot side of the TEC 30. This configuration is used whenever the die 2 must be tested at non-room temperatures, or when it is necessary to overcome internal heating of the bare die 2. Such a configuration will support the range of temperatures required for all known certification procedures including military certification for bare die 2. Specifically, military certification requires that the die be operationally certified at minus 55° Celsius as well as at plus 125° Celsius. If this configuration is used for testing discrete components or other devices, a practitioner should insure that its TEC is capable of supporting the rigid temperature range.

There are various methods which can be used for heating and cooling the die 2 during testing at extended temperatures. One method includes placing the die 2 and a die carrier 4 within the heating/cooling chamber of a temperature forcing unit (not shown) of some sort.

Heating and cooling chambers (not shown), however, take significantly longer than a TEC/auxiliary cooler to raise or lower the die temperature. A TEC 30, as is shown in FIG. 5, raises or lowers the temperature of the die 2 rapidly, owing to the use of conductive rather than convective heat transfer. The use of such a system greatly reduces overall test time and therefore, cost of performing the test. For instance, the use of a convective temperature forcing device such as a conventional oven (not shown) can take several times as long for the die 2 to reach the desired temperature. The method of using the thermoelectric cooler/heater is well known in the art and can be readily determined from the vendors of such devices.

The thermoelectric cooler shown in FIG. 5 includes vacuum line 26 for holding the die. An auxiliary cooling system may be used, containing an inlet line 24a, and an outlet line 24b for circulating cooled water through the auxiliary cooling system 24 which in turn further cools the TEC hot side. Finally, the inventor has found that it may be advantageous to purge the die with nitrogen gas to prevent frost build-up.

Figure 6:
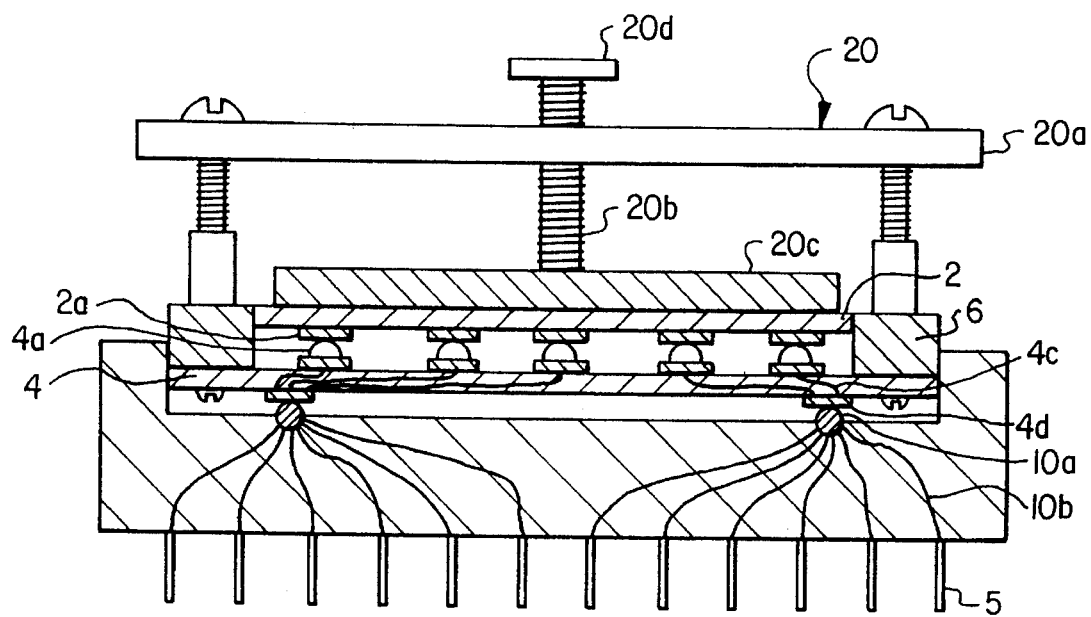
FIG. 6 shows a die clamp for room temperature or oven testing and a die carrier with a carrier connector.

Referring to FIG. 6, the clamp 20 supports "burn-in" testing in a conventional oven. Clamp 20, which is attached to the die carrier 4, will hold the die 2 in place such that the bond pads 2a of the die 2 maintain electrical continuity with the electrically conductive elastomeric probes 4a which are permanently attached to the circuit pads 4b of the die carrier 4. To use the clamp 20 of FIG. 6, one merely places the die 2 within the aperture 8 of the alignment template 6 and then one turns the knob 20d in a clockwise manner. The bolt 20b will rotate in a downward manner through clamp plate 20a thereby forcing clamp press 20c in a downward manner to urge the bare die 2 against the electrically conductive elastomeric bumps 4a. Note that a production socket (not shown) could accomplish the same task if a ceramic spacer 7a is placed within the socket. Because the die carrier 4 is electrically connected with the carrier connector 10, the carrier connector 10 may be plugged into a burn-in board 14 for the continuous "burn-in" testing process. The burn-in board 14, in turn, is connected to various pieces of test equipment through standard wiring in a manner well understood by those skilled in the art.

Historically, die 2 have been "burned in" after being packaged. Because electrical contacts with the external leads of the package can be reliably maintained, there is little reason to be concerned that electrical continuity will be lost during the burn-in process of a packaged die. However, since this single bare die 2 is not permanently packaged, continuous electrical contact during burn-in can no longer be assumed. Therefore, the method of burn-in for the bare die 2 includes continuous or periodic electronic data sampling to insure that electrical continuity is maintained. Once a die 2 successfully completes "burn-in" and post burn-in electrical tests, then that die 2 may be labelled or certified as a "known good die".

While "burn-in" is a term of art which varies significantly within the electronics industry, the inventor's burn-in process, as it relates to bare semiconductor die, is as follows: Initially, the die 2 is placed within a production socket (not shown) or within a die clamp 20 as is shown in FIG. 6 for pre-burn-in electrical testing. Once the die 2 is within a production socket (not shown) or a die clamp 20, it is connected to a piece of electrical test equipment for comprehensive functional testing of the die. In other words, the die is tested to the point that a practitioner can determine, in all probability, that each of the die's capabilities or functions works properly. Alternatively, the die 2 could be placed within a die carrier 4 that is thermally connected to a TEC 30, as is shown in FIG. 5, and then be comprehensively tested and exercised at an increased or decreased temperature. An advantage to performing a pre-burn-in test at a raised (or lowered) temperature is that a defective die is more likely to fall. Obviously, money is saved by identifying defective die as quickly as possible. The practitioner may utilize any type of production socket so long as it can house a die carrier 4 and an alignment template 6. In order to fully practice the invention as described herein, the production socket must also be able to house a spacer 7a sized to define the same geometric volume of space as defined by a thermoelectric cooler 30. One skilled in the art can readily determine the specific design of such a socket in order to practice this invention in a production environment.

Once a die successfully completes the pre-burn-in electrical test, whether at room or elevated temperatures, the die 2 and die carrier 4, whether in a production socket (not shown) or within a die clamp 20, are connected to a burn-in board 14 and then placed into an oven (not shown) and kept at a raised temperature for a length of time according to test or certification specifications. The inventor's preferred pre-burn-in method tests the die at elevated temperatures. However, other test procedures may require lowered temperatures. One example of a burn-in procedure would be to operate the die 2 through the burn-in board 14 within an oven at 125° Celsius for a minimum of 24 hours. For some applications, the die 2 may be kept in the oven for as many as 168 hours (or longer for other devices). The time that the die 2 is kept in the oven, as well as the oven temperature, is determined by the certification standard being followed for the particular die.

While the die 2 is within the oven, the die is "exercised" or operated at a level less than or equal to its full functional capability. Further, the operation is monitored repetitively to insure the die 2 has successfully operated and that electrical continuity has been maintained during the burn-in process. Because the die 2 is housed in temporary packaging and continuous electrical continuity cannot be assumed, a given output signal or contents of a data register should be repetitively checked to verify that new or fresh signals or data are being introduced into the die and that the die 2 is satisfactorily processing the signals or data. Finally, it should be noted that these burn-in procedures could be carried out with a thermoelectric cooler instead of in an oven. As a practical matter, however, burn-in testing in an oven allows for a greater number of die to be "burned in" simultaneously and is therefore preferred.

After burn-in, post burn-in electrical tests are conducted. Post burn-in electrical testing includes electrically testing the die 2 at 25° Celsius (ambient or room temperature), then at a high temperature, up to (+)125° Celsius, and finally at a low temperature, which can be as low as (−)55° Celsius. Again, the desired temperatures and the length of time for the comprehensive electrical testing are a function of the certification standard being applied to the specific die 2. Use of the thermoelectric cooler 30 for the post burn-in tests greatly expedites the test procedures because the thermoelectric cooler, in conjunction with an auxiliary cooling heat exchanger 24, greatly reduces the time necessary to raise and lower the temperature of the bare die 2, within approximately one minute. Further, this series of tests at the various temperatures can be performed without having to physically move or reconnect the die to any other equipment.

In order to properly use the disclosed invention, it may be necessary to clean each of the bond pads 2a of the bare die 2 prior to the bare die 2 being placed onto the conductive elastomeric probes 4a. An oxide buildup on the bond pads 2a may cause high resistance and prevent probe 4a from making electrical contact with pad 2a. The oxide buildup on the bond pads 2a may be removed chemically, ultrasonically, physically through the use of some sort of scrubbing device, or through some other method such as ion etching. It should be noted that the die 2 must be handled properly during the entire process, including the cleaning process, to prevent it from being damaged by spurious electrostatic charges.

The foregoing disclosure and description of the invention are given as illustrative and explanatory examples of the practice of the invention. Various changes in the size, shape, combination or elements of materials can be made without departing from the spirit and scope of the invention. Changes may also be made in the method of testing bare die. For example, the certification requirements for a die or device which is mature and known to have low failure rates may be satisfied by eliminating the burn-in test procedures. It is understood that the invention is not limited to the specific embodiments or methods disclosed and that many modifications and changes will be apparent from the description and drawings without departing from the scope of the attached claims.

I claim:

1. A reusable test socket for performing forced temperature pre-burn-in, burn-in and post burn-in electrical tests upon a singulated semiconductor bare die having bond pads thereon forming a bond pad pattern, said reusable test socket comprising:

die carrier having a top surface and a bottom surface;

a plurality of at least two-element structures for continuously and repetitively establishing electrical continuity between said bare die bond pads and said die carrier, each of said at least two-element structures being posed on said top surface of the die carrier to correspond with said bond pad pattern of the semiconductor bare die to be tested, each of said at least two-element structures comprising, a circuit pad, and an electrically conductive nonadhesive, malleable elastomeric probe placed on top of, and in electrical continuity with, said circuit pad;

a means for electrically connecting the at least two-element structures posed on the top surface of the die carrier to an instrument for testing the die; and a means for orienting the bond pads of the semiconductor bare die into alignment with corresponding at least two-element structures posed on the die carrier.

2. The test socket of claim 1 wherein the orienting means comprises an alignment template with an aperture, wherein the aperture shape approximates the shape of the bare semiconductor die to be tested.

3. The test socket of claim 1 wherein the orienting means comprises a plurality of guidance points located to describe the perimeter of the die to be tested, designed to receive the semiconductor bare die and to orient the bond pad pattern of the die into electrical alignment with the corresponding electrically conductive malleable elastomeric probes of the die carrier.

4. The test socket of claim 1 wherein the means for electrically connecting the bond pads to an instrument for testing further comprises:

a carrier connector adapted to be easily brought into electrical connection with the test instrument containing a plurality of individual leads attached to the carrier connector;

a plurality of connection pads posed onto the bottom surface of the die carrier electrically connected to the bond pads on the top of the die carrier; and connection pads, connected to the plurality of individual leads, posed onto a top surface of the carrier connector corresponding to connection pads on the bottom surface of the die carrier.

5. The test socket of claim 1 wherein the means for electrically connecting the bond pads to an instrument for testing further comprises:

a plurality of individual leads attached to the die carrier; and a direct and permanent electrical connection, in the form of standard circuit wiring, between each of the circuit pads posed on the top surface of the die carrier and the plurality of individual leads.

6. The test socket of claim 1 which further comprises a means for heating and cooling the die during testing.

7. The test socket of claim 6 wherein the means for heating and cooling the die comprises:

a thermoelectric cooler positioned on top of, and in thermal communication with, the die to urge the die against the conductive malleable elastomeric probes and to change the temperature of the die in accordance with the forced temperature electrical test requirements.

8. The test socket of claim 7 wherein the means for heating and cooling the die further comprises:

an auxiliary cooling unit positioned on top of, and in thermal communication with, a thermoelectric cooler hot side whereby a thermoelectric cooler cold side is adjacent to the bare die.

9. A process for burn-in testing of a singulated semiconductor bare die having bond pads, which bond pads form a bond pad pattern, said process comprising the steps of:

placing the semiconductor bare die into electrical contact with a reusable test socket for testing singulated bare die, said reusable test socket having a plurality of at least two-element structures comprising a circuit pad and a malleable, nonadhesive, elastomeric probe placed on top of said circuit pad for continuously and repetitively establishing electrical continuity between said bond pads and said reusable test socket;

urging the semiconductor die onto said plurality of malleable elastomeric probes to establish electrical continuity between the bond pads on the die being tested and the corresponding circuit pads of the test socket;

placing the reusable test socket for testing singulated bare die into electrical continuity with an instrument for testing the die;

placing the die into thermal communication with a temperature changing device;

exercising the die at a raised temperature for a sufficient amount of time to satisfy burn-in certification requirements; and periodically sampling electrical signal levels from the die to verify that electrical continuity exists between the die and the test socket while the die is being exercised during burn-in.

10. A process for testing singulated semiconductor bare die having bond pads thereon forming a bond pad pattern, said process comprising the steps of:

placing the semiconductor bare die into electrical contact with a reusable test socket for testing singulated bare die, said reusable test socket having a plurality of at least two-element structures comprising a circuit pad and a malleable, nonadhesive elastomeric probe placed on top of said circuit pad for continuously and repetitively establishing electrical continuity between said bond pads and said reusable test socket;

urging the semiconductor bare die onto a plurality of malleable elastomeric probes to insure that all of the bond pads on the die being tested are in electrical continuity with the corresponding circuit pads of the test socket;

placing the reusable test socket for testing singulated bare die into electrical continuity with an instrument for testing the die; and performing tests.

11. The process for testing of claim 10 which further comprises placing the die into thermal communication with a temperature changing device.

12. The process for testing of claim 10 which further comprises verifying electrical continuity periodically by measuring electrical signals being produced or stored by the bare die in order to determine that such signals are being produced or stored and therefore the a break in continuity has not occurred.

13. A process for performing forced temperature electrical tests upon a singulated bare die having bond pads thereon forming a bond pad pattern to determine whether the die is a known good die which comprises:

placing the semiconductor bare die into electrical continuity with a reusable test socket for testing singulated bare die, said reusable test socket having a plurality of at least two element structures comprising a circuit pad and a malleable, nonadhesive elastomeric probe placed on top of said circuit pad for continuously and repetitively establishing electrical continuity between said bond pads and said reusable test socket;

placing the reusable test socket for testing bare singulated die into electrical continuity with an instrument for testing the die;

placing the die into thermal communication with a thermoelectric cooler;

performing electrical tests upon the die at a raised or lowered temperature whereby the raised or lowered temperature increases the probability that a defective die will fail;

subsequently exercising the die while it is in thermal communication with a temperature changing device for an extended period of time sufficient to satisfy burn-in certification requirements;

periodically sampling electrical signal levels from the die to verify that electrical continuity exists between the die and the test socket while the die is in thermal communication with the temperature changing device and while the die is being exercised; and subsequently performing post burn-in testing which is comprised of in no particular order:
  electrically testing the die at ambient temperature wherein ambient temperature is approximately 25° Celsius,
  electrically testing the die at a high temperature wherein the high temperature can be as high as 125° Celsius and is determined by certification standards, and
  electrically testing the die at a low temperature wherein the low temperature can be as low as (−)55° Celsius and is determined by certification standards;
  whereby the die is certified as a known-good-die upon completion of the post burn-in testing.

14. The process for burn-in testing of a singulated semiconductor bare die of claim 9 comprising the preliminary step of testing the die either at a raised or at a lowered temperature prior to the step of exercising in the die at a raised temperature for a sufficient amount of time to satisfy burn-in certification requirements.

15. The process of claim 9 for burn-in testing of singulated semiconductor bare die comprising an additional step of testing the die after burn in at ambient temperature, at a raised temperature, and at a lowered temperature whereby the die is certified as a known-good-die upon successful completion of this post burn-in testing.

* * * * *